(12) United States Patent
Ono et al.

(10) Patent No.: US 6,905,771 B2
(45) Date of Patent: Jun. 14, 2005

(54) SILICON WAFER

(75) Inventors: Toshiaki Ono, Tokyo (JP); Tadami Tanaka, Tokyo (JP); Masataka Hourai, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 31 days.

(21) Appl. No.: 10/703,576

(22) Filed: Nov. 10, 2003

(65) Prior Publication Data

US 2004/0089225 A1 May 13, 2004

(30) Foreign Application Priority Data

Nov. 11, 2002 (JP) ......................................... 2002-327293

(51) Int. Cl.[7] ............................. B32B 9/00; C30B 15/04
(52) U.S. Cl. ......................... 428/446; 428/64.1; 117/2; 117/931; 117/932; 423/348
(58) Field of Search ............................... 428/64.1, 446; 117/2, 931, 932; 423/348

(56) References Cited

U.S. PATENT DOCUMENTS

| 4,631,234 A | * | 12/1986 | Larrabee ...................... 148/33 |
| 4,769,689 A | | 9/1988 | Lin .............................. 357/63 |
| 5,659,192 A | * | 8/1997 | Sarma et al. ................ 257/347 |
| 6,172,399 B1 | * | 1/2001 | Lee et al. .................... 257/336 |

FOREIGN PATENT DOCUMENTS

JP 2003209059 A * 7/2003 ......... H01L/21/205

* cited by examiner

Primary Examiner—Stephen Stein
(74) Attorney, Agent, or Firm—Kubovcik & Kubovcik

(57) ABSTRACT

A silicon wafer is doped with boron and germanium in a range that satisfies a relational expression defined by: $-0.8 \times 10^{-3} \leq 4.64 \times 10^{-24} \times [Ge] - 2.69 \times 10^{-23} \times [B] \leq 1.5 \times 10^{-3}$. This can reduce the miss-fit dislocation which might be induced when an epitaxial layer is grown over the silicon wafer that has been added with boron in high concentration. It is to be noted that in the above relational expression, the [B] denotes a boron concentration, while the [Ge] denotes a germanium concentration and a concentration unit is indicated by atoms/$cm^3$.

14 Claims, 1 Drawing Sheet

SILICON WAFER

BACKGROUND OF INVENTION

1. Field of Invention

The present invention generally relates to a silicon wafer, and in particular, to a wafer technology that is preferably applied to an epitaxial silicon wafer for an integrated circuit element of a semiconductor.

2. Description of the Related Art

A trend of increase in an integration level of an integrated circuit element (i.e., device) of a silicon semiconductor has rapidly progressed, and demands for the quality of a silicon wafer on which the device is to be formed has been getting stricter increasingly. Specifically, in association with the increase in the integration level, the integrated circuit becomes more minute in its scale. Due to this, in an area where the device is to be formed, or so-called, a device active region, a crystal defect, such as dislocation, and a metallic impurity are strictly inhibited. This is because those may cause an increased leak current and a reduced lifetime of carriers.

In recent years, a power semiconductor device has been used in an application of controlling a power supply. As a substrate for the power semiconductor device has been primarily used an epitaxial silicon wafer made of a silicon wafer obtained by slicing a silicon single crystalline ingot grown by the Czochralski (CZ) method, on which surface a silicon epitaxial layer containing substantially no crystal defect has been grown. This silicon wafer generally has been doped with a dopant in a high concentration.

There is a further demand in the power semiconductor device for providing a silicon wafer having a low resistivity aiming for achieving further reduced electric power consumption. For the silicon wafer of n-type, the silicon wafer having the resistivity of 0.002 Ωcm may be fabricated by doping it with arsenic (As) representative of an N-type dopant in a high concentration. Further, for the silicon wafer of p-type, boron (B) representative of a p-type dopant is used for doping to thereby form a substrate of the p-type epitaxial wafer.

However, in association with the silicon epitaxial layer grown on the surface of the silicon wafer having the resistivity especially not higher than 0.003 Ωcm, a miss-fit dislocation is induced within the epitaxial silicon wafer resultant from a difference between a lattice constant of the silicon wafer and a lattice constant of the silicon epitaxial layer. This miss-fit dislocation is shifted to the surface of the silicon epitaxial layer during the epitaxial growth, and thus the dislocation could appear in the device active region on which the semiconductor device is to be fabricated. In this way, if such a dislocation representing the crystal defect exists in the silicon epitaxial layer, it would be a factor in causing malfunctioning of the device and resultantly deteriorate a yield of nondefective product.

To solve the problems described above, there has been proposed such a prior art method as disclosed, for example, in U.S. Pat. No. 4,769,689, in which a silicon wafer doped with boron (B) is further doped with germanium (Ge). According to this method, by doping the silicon wafer with boron and germanium so as to satisfy the relational expression defined by [Ge]=8[B], the difference between the lattice constant of the silicon wafer doped with boron of no smaller than 0.002% (resistivity of no greater than 0.015 Ωcm) and the lattice constant of the silicon epitaxial layer may be cancelled thus to reduce the occurrences of the miss-fit dislocation. In the above expression, the [B] represents a boron concentration, while the [Ge] represents a germanium concentration.

However, if the CZ method is employed as the method for growing the silicon single crystal, owing to the fact that a segregation constant of boron is different from that of germanium, it will be impossible for all of the crystalline regions (throughout the crystal length) of the silicon crystal to grow while always satisfying the relation defined by above expression [Ge]=8[B]. Further, if high concentration of doping with boron were applied in order to reduce the resistivity of the silicon wafer, the doping volume required for germanium would be enormous. For example, assuming that the weight of the silicon of liquid phase is 35 kg for the boron concentration of $3.6 \times 10^{19}$ atoms/cm$^3$ (resistivity 0.003 Ωcm). Then, the necessary germanium amount should be 1.5 kg. Since germanium is very expensive, manufacturing cost of the silicon wafer would be increased. Further, according to the study by the inventors, it has been found that if boron is added in high concentration and at the same time germanium is used for doping also in the high concentration, then the probability of first dislocation generation of the silicon single crystal during the growing of the silicon single crystal could be higher, leading to the deterioration of the crystal yield in manufacturing of the silicon single crystalline ingot.

BRIEF SUMMARY OF THE INVENTION

An object of the present invention is to provide a silicon wafer and an epitaxial silicon wafer, in which the occurrence of the miss-fit dislocation can be reduced effectively.

Further, another object of the present invention is to provide a silicon wafer and an epitaxial silicon wafer, in which the occurrence of the miss-fit dislocation can be reduced effectively even when the silicon epitaxial layer is to be grown on a surface of the silicon wafer having a resistivity of no higher than 0.003 Ωcm where the miss-fit dislocation is more likely to occur.

According to a first invention, there is provided a silicon wafer fabricated by slicing a silicon single crystalline ingot that has been grown by the Czochralski method and added with boron and germanium, said silicon wafer characterized in that said silicon wafer is doped with said boron and said germanium within a range that can satisfy a relational expression defined by $-0.8 \times 10^{-3} \leq 4.64 \times 10^{-24} \times [Ge] - 2.69 \times 10^{-23} \times [B] \leq 1.5 \times 10^{-3}$. In this expression, the [B] represents a boron concentration, while the [Ge] represents a germanium concentration, wherein a concentration unit is indicated by atoms/cm$^3$.

It has been understood that the miss-fit dislocation that may occur in the case of depositing a silicon epitaxial film over a surface of the silicon wafer added with boron in high concentration is resultant from a difference between a lattice constant of the silicon wafer side and a lattice constant in the silicon epitaxial film. A variation in the lattice constant ($\Delta a_{Si-B}$, by angstrom unit) due to the variation of the boron concentration is calculated by the following equation (Vegard's law).

$$\Delta a_{Si-B} = a_{Si} \times (r_B - r_{Si})/r_{Si} \times [B]/[Si] \tag{1a}$$

where, $a_{Si}$ is the lattice constant of a silicon single crystal added with no element. Further, the $r_B$ denotes a radius of the boron (B) atoms, the $r_{Si}$ denotes a radius of the silicon (Si) atom, the [B] denotes the boron concentration and the [Si] denotes the silicon concentration. The radius of the boron atoms is 0.88 angstrom, and that of the silicon atom is 1.17 angstroms. The lattice constant of the highly purified silicon single crystal ($a_{Si}$) is 5.43 angstroms. Further, the Si atom density of the silicon single crystal is $5.0 \times 10^{22}$ atmos/cm$^3$. From the above, the equation (1a) may be expressed as:

$$\Delta a_{Si-B} = -2.69 \times 10^{-23} \times [B] \quad (1b)$$

As apparent from the equation, for the silicon wafer added with boron in high concentration, the lattice constant will be smaller than that added with no boron.

On one hand, the variation in lattice constant for the doping with germanium ($\Delta a_{Si-Ge}$, by angstrom unit) can be calculated by using the Vegard's law similarly to the equation (1a).

$$\Delta a_{Si-Ge} = a_{Si} \times (r_{Ge} - r_{Si})/r_{Si} \times [Ge]/[Si] \quad (2a)$$

where, the $r_{Ge}$ denotes a radius of the germanium atom, which is 1.22 angstroms while the [Ge] denotes the concentration of germanium. Thus, the equation (2a) may be expressed as:

$$\Delta a_{Si-Ge} = 4.64 \times 10^{-24} [Ge] \quad (2b)$$

Consequently, the lattice constant will become greater by adding germanium than the case of no boron added.

From the above, the variation in lattice constant for the case of adding of boron and germanium altogether ($\Delta a_{Si-Ge-B}$, by angstrom unit) can be determined by the sum of the equation (1b) and the equation (2b), which will be expressed by the following equation.

$$\Delta a_{Si-Ge-B} = \Delta a_{Si-Ge} + \Delta a_{Si-B} = 4.64 \times 10^{-24} \times [Ge] - 2.69 \times 10^{-23} \times [B] \quad (3)$$

The doping with germanium along with boron can suppress the lattice variation within the silicon wafer defined by the epitaxial substrate, thus reducing the difference between the lattice constant of the silicon epitaxial layer and that of the silicon wafer. It has been considered that this could inhibit the occurrence of the miss-fit dislocation.

As for the case where $4.64 \times 10^{-24} \times [Ge] - 2.69 \times 10^{-23} \times [B]$ is smaller than $-0.8 \times 10^{-3}$ or where $4.64 \times 10^{-24} \times [Ge] - 2.69 \times 10^{-23} \times [B]$ is greater than $1.5 \times 10^{-3}$, the miss-fit dislocation should occur.

Preferably, an initial oxygen concentration in the silicon single crystalline ingot should be no lower than $1.0 \times 10^{18}$ atoms/cm$^3$ in order to inhibit the deterioration of strength of the silicon wafer due to insufficient oxygen and also to ensure an amount of oxygen precipitation required to obtain a sufficient IG effect.

Further, in the case of no germanium added, if the boron concentration in the silicon wafer is $3.6 \times 10^{19}$ atoms/cm$^3$, then the thickness of 2 μm or more of the silicon epitaxial layer may lead to the occurrence of the miss-fit dislocation with high possibility. In contrast to this, for the case of the boron concentration of $1.1 \times 10^{19}$ atoms/cm$^3$, the thickness of 15 μm or more of the silicon epitaxial layer may cause the miss-fit dislocation. Specifically, the effect of the present invention can be expected even with such a silicon wafer as having the boron concentration of not higher than $3.6 \times 10^{19}$ atoms/cm$^3$ if it is allowed to grow the epitaxial layer to be thick.

According to the silicon wafer defined in the first invention, in order to grow the silicon single crystal by the Czochralski method, boron and germanium may be added to the silicon of liquid phase within a range satisfying the relational expression of $-0.8 \times 10^{-3} \leq 4.64 \times 10^{-24} \times [Ge] - 2.69 \times 10^{-23} \times [B] \leq 1.5 \times 10^{-3}$.

If a large amount of boron which may satisfy the above expression is added to the silicon of liquid phase, the resistivity of the silicon wafer is lowered significantly. For the silicon wafer having such a low resistivity, typically, a difference in the lattice constants between the silicon wafer and the silicon epitaxial layer to be grown on the wafer surface is great, which means that the miss-fit dislocation could be more likely to occur. However, this reduction in lattice constant of the silicon due to the addition of large amount of boron may be suppressed by adding germanium. Germanium has an effect that enables the lattice constant of the silicon to be increased. Owing to this, when the silicon epitaxial layer is to be grown over the silicon wafer, the difference in the lattice constants between the silicon epitaxial layer and the silicon wafer can be made smaller. Consequently, a possible occurrence of the miss-fit dislocation can be suppressed effectively.

A second invention provides a silicon wafer in accordance with that defined by the first invention, characterized in further doped with carbon in a concentration of not lower than $1 \times 10^{16}$ atoms/cm$^3$.

It has been considered that the occurrence of the miss-fit dislocation involves in not only the above-mentioned mismatching of the lattice constant of the silicon wafer with that of the silicon epitaxial layer but also an amount of plastic deformation of the silicon wafer caused by the effect from a thermal stress during the epitaxial growth of the silicon epitaxial layer. In the light of this teaching, comparing the silicon wafer having doped with carbon in addition to germanium with the silicon wafer having doped with boron and germanium, the occurrence of the miss-fit dislocation has been inhibited in the former case. Although the reason for that is not exactly known, anyhow such an effect may be expected that the doping with carbon can increase the resistance against the thermal stress, and accordingly the amount of plastic deformation during the epitaxial growth can be reduced.

Further, if the silicon single crystal is doped with carbon, an amount of formation of core for the oxygen precipitation will be increased, and thereby more number of defect (BMD: Bulk Micro Defect) induced by the annealing will be observed than the case of no doping with carbon.

The oxygen precipitation is useful for an IG (Intrinsic Gettering) for capturing heavy metal atoms generated during the fabrication of devices into the silicon wafer. Owing to this, the silicon wafer having a higher BMD density has a greater IG effect and is advantageous to improve the yield in the device fabrication.

A silicon wafer according to the second invention is made by adding not only boron and germanium but also carbon in a concentration of no lower than $1 \times 10^{16}$ atoms/cm$^3$ into a silicon of liquid phase. In this way, by doping the silicon wafer with carbon, the resistance against the thermal stress is increased. In the subsequent step for the epitaxial growth of the silicon over the silicon wafer, the amount of plastic deformation is reduced. Accordingly, in comparison with the silicon wafer that has been doped exclusively with boron and germanium, the occurrence of the miss-fit dislocation can be inhibited effectively. Further, the doping with carbon may increase the formation of core for the oxygen precipitation after the epitaxial growth. Owing to this, a greater number of BMD is produced as compared with the case of no carbon doping applied, thereby enhancing the IG effect of the silicon wafer. Consequently, this may help increase the yield in the device fabrication.

A third invention provides a silicon wafer in accordance with that defined by the first invention, characterized in that said boron concentration is not lower than $3.6 \times 10^{19}$ atoms/cm$^3$ and a resistivity of said silicon wafer is not higher than 0.003 Ωcm.

In general, if the silicon epitaxial layer is formed over the silicon wafer having the boron concentration of no lower than $3.6 \times 10^{19}$ atoms/cm$^3$ and its resistivity of not higher than 0.003 Ωcm, especially miss-fit dislocation is more apt to occur as compared to the case of other silicon wafers having relatively higher resistivity to be used. Because of the above fact, adding of a predetermined amount of germanium as specified in the present invention will take effect.

Generally, the silicon single crystalline ingot having the boron concentration increased up to a level as high as that described above will induce the miss-fit dislocation more easily. However, germanium that has been added at the same time with boron may inhibit the reduction of the lattice constant of the silicon otherwise caused by adding boron in high concentration. Consequently, the occurrence of the miss-fit dislocation can be suppressed.

A fourth invention provides a silicon wafer in accordance with that defined by the third invention, characterized in further doped with carbon in a concentration of not lower than $1 \times 10^{16}$ atoms/cm$^3$.

A fifth invention provides a silicon wafer in accordance with that defined by the third invention, characterized in that said germanium concentration is controlled so as not to exceed a level five times as high as said boron concentration.

A preferred scale factor of the germanium concentration to the boron concentration is in a range of 1.4 to 5. The scale factor higher than 5 will increase the probability of first dislocation generation of the silicon single crystal during the growth of the silicon single crystal and reduce the yield of crystal in fabrication of the silicon single crystalline ingot.

According to the silicon wafer as defined in the fifth invention, the germanium concentration is controlled so as not to be five times as high as the boron concentration. This may help reduce the dosage of germanium as compared to the prior art defining that the germanium concentration is eight times as high as the boron concentration. Germanium is expensive. Accordingly, the manufacturing cost of the silicon wafer can be reduced. Further, the doping with boron and germanium in high concentration may increase the probability of the first dislocation generation of the silicon single crystal during the growth of the silicon single crystal. However, since the amount of added germanium is less than that according to the prior art, the probability of the first dislocation generation can be also suppressed. Consequently, the yield of crystal during the manufacturing of the silicon single crystal ingot can be increased.

A sixth invention provides a silicon wafer in accordance with that defined by the fifth invention, characterized in further doped with carbon in a concentration of not lower than $1 \times 10^{16}$ atoms/cm$^3$.

A seventh invention provides a silicon wafer in accordance with that defined by the first invention, characterized in that an initial oxygen concentration in said silicon single crystalline ingot is not lower than $1.0 \times 10^{18}$ atoms/cm$^3$.

By specifying the initial oxygen concentration in the silicon single crystalline ingot to the above value, the deterioration of the strength of the silicon wafer otherwise caused by the insufficient oxygen concentration can be inhibited, while insuring the amount of oxygen precipitation required to obtain a sufficient IG effect.

According to an eighth invention, there is provided an epitaxial silicon wafer which has a silicon epitaxial layer grown on a surface of a silicon wafer obtained by slicing a silicon single crystalline ingot into the silicon wafer, that has been grown by the Czochralski method and added with boron and germanium, said epitaxial silicon wafer characterized in that said silicon wafer has been doped with said boron and said germanium within a range that can satisfy a relational expression defined by $-0.8 \times 10^{-3} \leq 4.64 \times 10^{-24} \times [Ge] - 2.69 \times 10^{-23} \times [B] \leq 1.5 \times 10^{-3}$. It is to be noted that in the above expression, the [B] denotes the boron concentration, while the [Ge] denotes the germanium concentration and the concentration unit is defined by atoms/cm$^3$.

A method for growing the silicon epitaxial layer is not limited to any certain method. For example, a vapor phase epitaxial growth method or a molecular beam epitaxial growth method may be employed.

In the vapor epitaxial growth, for example, SiH$_4$, SiH$_2$Cl$_2$, SiHCl$_3$ and SiCl$_4$ may be employed as a source gas.

According to the epitaxial silicon wafer defined in the eight invention, in order to grow the silicon single crystal by the Czochralski method, boron and germanium may be added to the silicon of liquid phase within a range satisfying the relational expression of $-0.8 \times 10^{-3} \leq 4.64 \times 10^{-24} \times [Ge] - 2.69 \times 10^{-23} \times [B] \leq 1.5 \times 10^{-3}$.

If a large amount of boron which may satisfy the above expression is added to the silicon of liquid phase, the resistivity of the silicon wafer is lowered significantly. For the silicon wafer having such a low resistivity, typically, a difference in the lattice constants between the silicon wafer and the silicon epitaxial layer to be grown on the wafer surface is great, which means that the miss-fit dislocation could be more likely to occur. However, the reduction in lattice constant of the silicon due to the addition of large amount of boron may be suppressed by adding germanium. Germanium has an effect that enables the lattice constant of the silicon to be increased. Owing to this, when the silicon epitaxial layer is to be grown over the silicon wafer, the difference in the lattice constants between the silicon epitaxial layer and the silicon wafer can be made smaller. Consequently, a possible occurrence of the miss-fit dislocation can be suppressed effectively. This enables the epitaxial silicon wafer having good device characteristics to be fabricated, while inhibiting the miss-fit dislocation from being induced.

A ninth invention provides an epitaxial silicon wafer in accordance with that defined by the eight invention, characterized in that said silicon wafer has been doped with carbon in a concentration of not lower than $1 \times 10^{16}$ atoms/cm$^3$.

In this epitaxial silicon wafer, in addition to boron and germanium, carbon in a concentration of no lower than $1 \times 10^{16}$ atoms/cm$^3$ is added into the silicon of liquid phase. In this way, by doping the silicon wafer with carbon, the resistance against the thermal stress is increased. In the subsequent step for the epitaxial growth of the silicon epitaxial layer over the silicon wafer, the amount of plastic deformation is reduced. Accordingly, in comparison with the silicon wafer that has been doped exclusively with boron and germanium, the occurrence of the miss-fit dislocation can be inhibited effectively. Further, the doping with carbon may increase the formation of core for the oxygen precipitation after the epitaxial growth. Owing to this, a greater number of BMD is produced as compared with the case of no carbon doping applied, thereby enhancing the IG effect of the silicon wafer. Consequently, this may help increase the yield in the device fabrication.

A tenth invention provides an epitaxial silicon wafer in accordance with that defined by the eighth invention, characterized in that said boron concentration is not lower than $3.6 \times 10^{19}$ atoms/cm$^3$ and a resistivity of said silicon wafer is not higher than 0.003 Ωcm.

In general the silicon single crystalline ingot having the boron concentration increased up to a level as high as that described above will induce the miss-fit dislocation more easily. However, germanium that has been added at the same time with boron may inhibit the reduction of the lattice constant of the silicon otherwise caused by adding boron in high concentration as described above. Consequently, the occurrence of the miss-fit dislocation can be suppressed.

An eleventh invention provides an epitaxial silicon wafer in accordance with that defined by the tenth invention, characterized in that said silicon wafer has been doped with carbon in a concentration of not lower than $1\times10^{16}$ atoms/cm$^3$.

A twelfth invention provides an epitaxial silicon wafer in accordance with that defined by the tenth invention, characterized in that said germanium concentration is controlled so as not to exceed a level five times as high as said boron concentration.

The epitaxial silicon wafer according to the twelfth invention may help reduce the dosage of germanium as compared to the prior art defining that the germanium concentration is eight times as high as the boron concentration. Germanium is expensive. Accordingly, the manufacturing cost of the epitaxial silicon wafer can be reduced. Further, the doping with boron and germanium in high concentration may increase the probability of the first dislocation generation of the silicon single crystal during the growth of the silicon single crystal. However, since the amount of added germanium is less than that according to the prior art, the probability of the first dislocation generation can be also suppressed. Consequently, the yield of crystal during the manufacturing of the silicon single crystal ingot can be increased.

A thirteenth invention provides an epitaxial silicon wafer in accordance with that defined by the twelfth invention, characterized in that said silicon wafer has been doped with carbon in a concentration of not lower than $1\times10^{16}$ atoms/cm$^3$.

A fourteenth invention provides an epitaxial silicon wafer in accordance with that defined by the eighth invention, characterized in that an initial oxygen concentration in said silicon single crystalline ingot is not lower than $1.0\times10^{18}$ atoms/cm$^3$.

The deterioration of the strength of the silicon wafer otherwise caused by the insufficient oxygen concentration can be inhibited. At the same time, the sufficient IG effect can be also obtained.

DETAILED DESCRIPTION OF THE INVENTION

Figure 1:
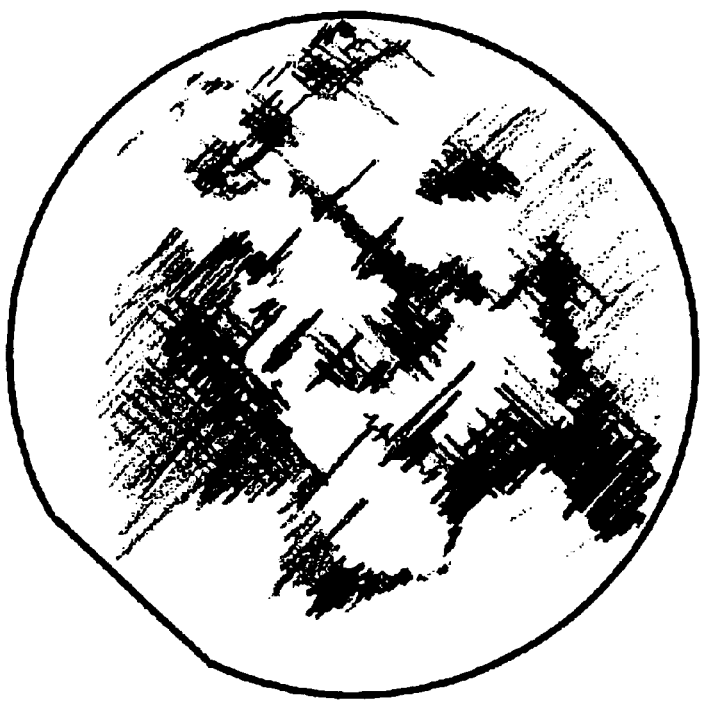
FIG. 1 is a plan view showing an X-ray topography of a comparative example in Table 1.

Preferred embodiments of the present invention will now be described with reference to the attached drawings. It is to be noted that the invention is not limited to those embodiments.

EXAMPLE 1

In the processes for a growth of a silicon single crystalline ingot by the Czochralski method, we employed a process (1) in which a silicon of liquid phase was doped with a predetermined amount of boron as well as a predetermined amount of germanium, and a silicon single crystal having a diameter of 150 mm was grown. We employed also another process (2) in which a silicon of liquid phase was doped with boron, germanium and carbon each by a predetermined amount, and a silicon single crystal having a diameter of 150 mm was grown. For the measurement of the concentration of boron, germanium and carbon, the Secondary Ion Mass Spectrometer (SIMS) was used. Each one of the silicon single crystal ingots fabricated by the processes (1) and (2) was sliced into a silicon wafer, which in turn was processed according to an established procedure by applying a sequence of steps consisting of chamfering, lapping, acid etching and mirror polishing to be formed into the silicon wafer. Subsequently, the silicon wafers from (1) and (2) were inserted into an epitaxial growth apparatus and processed by hydrogen baking at 1150° C., respectively. After that, those were supplied with SiHCl$_3$ gas under the temperature condition at 1075° C. within the epitaxial growth apparatus so as to allow the 6 µm or 15 µm thick silicon epitaxial layers to grow respectively over the surfaces of respective silicon wafers. Thus, those epitaxial silicon wafers having the substrates of the silicon wafers from (1) and (2) were fabricated, respectively.

After that, the surface of the epitaxial layer of each epitaxial silicon wafer was examined by an X-ray topography and the occurrence of the miss-fit dislocation was observed, respectively.

Then, those epitaxial silicon wafers were subjected to the annealing (heat treatment) at 800° C. for 4 hours. Subsequently, they were subjected to another annealing at 1000° C. for 16 hours, and then cleaved, and further processed by applying thereto a selective etching with a light etchant (HF+HNO$_3$+CrO$_3$+Cu(NO$_3$)$_2$+H$_2$O+CH$_3$—COOH) for 3 minutes. Then, a density of defect created within the silicon wafer by the thermal treatment was determined by using the optical microscope to count etching pits per 1 cm$^2$, results from which are shown in Table 1.

TABLE 1

|  | Resistivity (Ωcm) | Boron concentration ($\times 10^{19}$ atoms/cm$^3$) | Germanium concentration ($\times 10^{20}$ atoms/cm$^3$) | Carbon Concentration ($\times 10^{16}$ atoms/cm$^3$) | $\Delta a_{Si-Ge-B}$ ($\times 10^{-3}$) | Miss-fit dislocation occurrence | Epi thickness (µm) | BMD density ($\times 10^6$ pieces/cm$^2$) |
|---|---|---|---|---|---|---|---|---|
| Comparative example 1 | 0.003 | 3.6 | not doped | not doped | −0.97 | X | 6 | 3.61 |
| Comparative example 2 | 0.003 | 3.6 | 5.5 | not doped | 1.58 | Δ | 6 | 3.13 |
| Comparative example 3 | 0.003 | 3.6 | 5.5 | not doped | 1.58 | X | 15 | 3.10 |

TABLE 1-continued

|  | Resistivity (Ωcm) | Boron concentration (× $10^{19}$ atoms/cm$^3$) | Germanium concentration (× $10^{20}$ atoms/cm$^3$) | Carbon Concentration (× $10^{16}$ atoms/cm$^3$) | $\Delta a_{Si-Ge-B}$ (× $10^{-3}$) | Miss-fit dislocation occurrence | Epi thickness (μm) | BMD density (× $10^6$ pieces/cm$^2$) |
|---|---|---|---|---|---|---|---|---|
| Test example 1 | 0.003 | 3.6 | 0.51 | not doped | −0.73 | ○ | 6 | 3.30 |
| Test example 2 | 0.002 | 5.6 | 1.90 | not doped | −0.63 | ○ | 6 | 2.87 |
| Test example 3 | 0.003 | 3.6 | 0.51 | not doped | −0.73 | Δ | 15 | 2.72 |
| Test example 4 | 0.002 | 5.6 | 1.92 | not doped | −0.62 | ○ | 15 | 3.10 |
| Test example 5 | 0.003 | 3.6 | 0.50 | 0.52 | −0.74 | Δ | 15 | 2.91 |
| Test example 6 | 0.003 | 3.6 | 0.51 | 1.21 | −0.73 | ○ | 15 | 6.32 |

Miss-fit dislocation occurrence
(○: not observed at all, Δ: occurred partially in a wafer, X: occurred entirely in a wafer)

The comparative example 1 was not doped with germanium. Due to this, the lattice constant variation ($\Delta a_{Si-Ce-B}$) was lower than $-0.8 \times 10^{-3}$ atoms/cm$^3$, and the miss-fit dislocation was observed. In those test examples 1 and 2 that were doped with germanium, the lattice constant variation ($\Delta a_{Si-Ce-B}$) was not lower than $-0.8 \times 10^{-3}$ atoms/cm$^3$ and not higher than $1.5 \times 10^{-3}$ atoms/cm$^3$, showing that the occurrence of miss-fit dislocation was inhibited. The comparative example 2 was doped with germanium such that the doping amount of germanium thereof might make higher concentration of doping as compared to the testing examples 1 and 2. Owing to this, the $\Delta a_{Si-Ge-B}$ exceeded $1.5 \times 10^{-3}$ atoms/cm$^3$, and the miss-fit dislocation was observed in a part of the silicon wafer.

Figure 2:
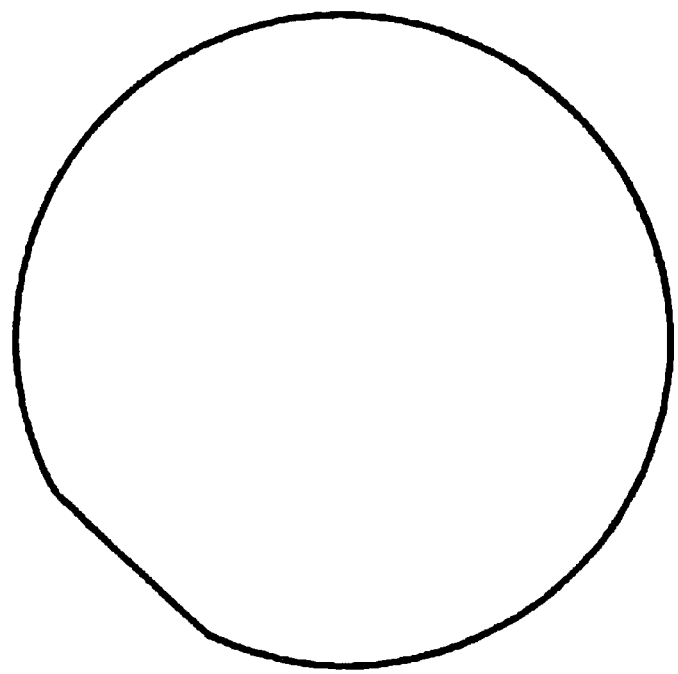
FIG. 2 is a plan view showing an X-ray topography of a test example in Table 1.

By way of example of the occurrence of the miss-fit dislocation, the X-ray topography image of the comparative example 1 is shown in FIG. 1. The high-density of miss-fit dislocation is observed across the entire surface of the silicon wafer. Further, the X-ray topography image of the testing example 1 that has been added with boron and germanium is shown in FIG. 2. It can be seen that the occurrence of the miss-fit dislocation was inhibited significantly as compared to the comparative example 1.

Among the testing examples 3 and 4 and the comparative example 3, in which the epitaxial layers were allowed to grow to have the film thickness as thick as 15 μm, specifically in the testing example 3 having the $\Delta a_{Si-Ge-B}$ of $-0.73 \times 10^{-3}$ atoms/cm$^3$, the miss-fit dislocation was observed in the wafer peripheral portion. However, it was not so serious that can be problematic. The testing example 4 has no miss-fit dislocation observed at all. In the comparative example 3 having the $\Delta a_{Si-Ge-B}$ of $1.58 \times 10^{-3}$ atoms/cm$^3$, since the epitaxial layer thereof had thicker film thickness as compared to the comparative example 2, a greater number of miss-fit dislocations were observed across the entire surface of the wafer. In the testing example 5 doped with carbon, the carbon concentration was lower than $1 \times 10^{16}$ atoms/cm$^3$. Owing to this, the level of occurrence of the miss-fit dislocation or the BMD density thereof was not much different from those in the testing example 3. In the testing example 6, the carbon concentration of which was not lower than $1 \times 10^{16}$ atmos/cm$^3$, the occurrence of the miss-fit dislocation was suppressed better as compared to the testing example 3 and the BMD density was observed to be high level.

EXAMPLE 2

Subsequently, we had made a research to see the effect on the crystal yield of adding boron of high concentration and germanium of high concentration altogether at the same time during the growth of the silicon single crystalline ingot by the CZ method. Specifically, the concentration ratios of boron and germanium were changed, and a plurality of silicon single crystal ingots of 150 mm diameter having different concentration ratios (n pieces=each 4 pieces) were grown, on which the occurrence of the first dislocation generation was observed. The results are shown in Table-2. In the table, ○ indicates the case where the silicon single crystal has grown without any dislocation along the full length thereof and X indicates the case where the dislocation has occurred in the silicon single crystal in the course of the growth of the single crystal.

TABLE 2

|  | Boron concentration (× $10^{19}$ atoms/cm$^3$) | Germanium concentration (× $10^{20}$ atoms/cm$^3$) | Boron concentration/ Germanium concentration | Occurrence of dislocation in single crystal | | | |
|---|---|---|---|---|---|---|---|
|  |  |  |  | $1^{st}$ piece | $2^{nd}$ piece | $3^{rd}$ piece | $4^{th}$ piece |
| Comparative example 4 | 3.6 | 5.05 | 14.02 | X | X | X | ○ |
| Comparative example 5 | 3.6 | 1.9 | 5.3 | X | X | ○ | ○ |
| Comparative example 6 | 5.6 | 3.1 | 5.3 | ○ | X | ○ | X |

TABLE 2-continued

|  | Boron concentration (× $10^{19}$ atoms/cm³) | Germanium concentration (× $10^{20}$ atoms/cm³) | Boron concentration/ Germanium concentration | Occurrence of dislocation in single crystal | | | |
|---|---|---|---|---|---|---|---|
|  |  |  |  | 1st piece | 2nd piece | 3rd piece | 4th piece |
| Test example 7 | 5.6 | 2.25 | 4.02 | ○ | ○ | X | ○ |
| Test example 8 | 3.6 | 0.51 | 1.4 | ○ | ○ | ○ | ○ |
| Test example 9 | 3.6 | 1.0 | 3.6 | ○ | ○ | ○ | ○ |
| Test example 10 | 5.6 | 1.20 | 2.14 | ○ | ○ | ○ | ○ |

As apparent from Table 2, in the comparative examples 4 through 6, in which the concentration of the added germanium exceeds the level five times as high as that of the boron, the ratio of no dislocation is not higher than 50% for each one of those, from which it can be seen that the yield of the silicon single crystal without dislocation has been reduced. In contrast to this, in the testing examples 7 through 10, in which the concentration of the added germanium does not exceed the level five times as high as that of the boron, the yield of the silicon single crystal without dislocation has been improved significantly.

Thus, the miss-fit dislocation occurrence during the growth of the epitaxial film can be prevented by controlling the doping with boron and germanium such that the concentration thereof to be added may be in the range defined by: $-0.8 \times 10^{-3} \leq 4.64 \times 10^{-24} \times [Ge] - 2.69 \times 10^{-23} \times [B] \leq 1.5 \times 10^{-3}$. Especially, if the doping is controlled such that the concentration of the added germanium may not exceed the level five times as high as that of the boron, the occurrence of the first dislocation generation can be inhibited effectively.

What is claimed is:

1. A silicon wafer fabricated by slicing a silicon single crystalline ingot that has been grown by the Czochralski method and added with boron and germanium, wherein
said silicon wafer is doped with said boron and said germanium within a range that satisfies a relational expression defined by:

$$-0.8 \times 10^{-3} \leq 4.64 \times 10^{-24} \times [Ge] - 2.69 \times 10^{-23} \times [B] \leq 1.5 \times 10^{-3}$$

where, the [B] denotes a boron concentration, while the [Ge] denotes a germanium concentration and a concentration unit is indicated by atoms/cm³.

2. A silicon wafer in accordance with claim 1, which has been further doped with carbon in a concentration of not lower than $1 \times 10^{16}$ atoms/cm³.

3. A silicon wafer in accordance with claim 1, in which said boron concentration is not lower than $3.6 \times 10^{19}$ atoms/cm³ and a resistivity of said silicon wafer is not higher than 0.003 Ωcm.

4. A silicon wafer in accordance with claim 3, which has been further doped with carbon in a concentration of not lower than $1 \times 10^{16}$ atoms/cm³.

5. A silicon wafer in accordance with claim 3, in which said germanium concentration is controlled so as not to exceed a level five times as high as said boron concentration.

6. A silicon wafer in accordance with claim 5, which has been further doped with carbon in a concentration of not lower than $1 \times 10^{16}$ atoms/cm³.

7. A silicon wafer in accordance with claim 1, in which an initial oxygen concentration in said silicon single crystalline ingot is not lower than $1.0 \times 10^{18}$ atoms/cm³.

8. An epitaxial silicon wafer which has a silicon epitaxial layer grown on a surface of a silicon wafer obtained by slicing a silicon single crystalline ingot into the silicon wafer, that has been grown by the Czochralski method and added with boron and germanium, wherein
said silicon wafer has been doped with said boron and said germanium within a range that satisfies a relational expression defined by:

$$-0.8 \times 10^{-3} \leq 4.64 \times 10^{-24} \times [Ge] - 2.69 \times 10^{-23} \times [B] \leq 1.5 \times 10^{-3}$$

where, the [B] denotes a boron concentration, while the [Ge] denotes a germanium concentration and a concentration unit is indicated by atoms/cm³.

9. An epitaxial silicon wafer in accordance with claim 8, in which said silicon wafer has been further doped with carbon in a concentration of not lower than $1 \times 10^{16}$ atoms/cm³.

10. An epitaxial silicon wafer in accordance with claim 8, in which said boron concentration is not lower than $3.6 \times 10^{19}$ atoms/cm³ and a resistivity of said silicon wafer is not higher than 0.003 Ωcm.

11. An epitaxial silicon wafer in accordance with claim 10, in which said silicon wafer has been doped with carbon in a concentration of not lower than $1 \times 10^{16}$ atoms/cm³.

12. An epitaxial silicon wafer in accordance with claim 10, in which said germanium concentration is controlled so as not to exceed a level five times as high as said boron concentration.

13. An epitaxial silicon wafer in accordance with claim 12, in which said silicon wafer has been doped with carbon in a concentration of not lower than $1 \times 10^{16}$ atoms/cm³.

14. An epitaxial silicon wafer in accordance with claim 8, in which an initial oxygen concentration in said silicon single crystalline ingot is not lower than $1.0 \times 10^{18}$ atoms/cm³.

* * * * *